(12) United States Patent
Slupe et al.

(10) Patent No.: US 6,570,271 B2
(45) Date of Patent: May 27, 2003

(54) APPARATUS FOR ROUTING SIGNALS

(75) Inventors: James P. Slupe, Caldwell, ID (US); Timothy V. Harper, Boise, ID (US); Fred R. Wiedeback, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/859,851

(22) Filed: May 16, 2001

(65) Prior Publication Data

US 2002/0171127 A1 Nov. 21, 2002

(51) Int. Cl.[7] ................................................ H01L 29/72
(52) U.S. Cl. ........................ 307/89; 257/671; 257/673; 307/91; 307/92
(58) Field of Search ................................. 257/666, 671, 257/673; 307/89, 91, 92

(56) References Cited

U.S. PATENT DOCUMENTS 5,383,788 A * 1/1995 Spencer ...................... 257/688

* cited by examiner

Primary Examiner—Edward Wojciechowicz

(57) ABSTRACT

An apparatus for routing signals to and from at least one circuit component that has a plurality of input/output leads includes a support structure having a first side and a second side. The first side is adapted to have the input/output leads of the circuit component attached thereto. A signal routing strip having a first end and a second end is also included. The first end of the routing strip is configured and adapted to be electrically connected to the input/output leads of the circuit component for transmitting signals to and from the circuit component.

14 Claims, 5 Drawing Sheets

APPARATUS FOR ROUTING SIGNALS

BACKGROUND

The present invention generally relates to apparatus for routing signals to and from circuit components, and more particularly to apparatus for reducing signal routing complexity and congestion, and increasing signal routing flexibility.

The use of various integrated chips (ICs) having leads or contacts which protrude from the bottom or the sides of the packages and adapted to be positioned on a printed circuit board (PCB) is commonly known. Typically, signals to and from components on the PCB are transmitted through signal paths formed in the PCB. These paths are generally electrically conductive traces which have a relatively fine width and imbedded in the multiple layers of the PCB to accommodate numerous signals.

This known method of routing signals may be adequate for purposes of routing signals between a relatively small number of circuit components. However, it is not suitable when a large number of components, and a correspondingly large number of signal paths between them, are required. The increase in the number of circuit components on the PCB significantly increases the complexity of the signal paths on the PCB, resulting in higher manufacturing costs. Expanding the size of the PCB to accommodate the increased number of circuit components could lead to stress fracturing of the delicate signal traces. Also, the known method of signal routing is specific to a particular circuit component configuration. Consequently, a PCB configured for one purpose generally would not be suitable for different applications.

DETAILED DESCRIPTION

Broadly stated, the present invention is directed to an apparatus for routing signals to and from at least one circuit component that has a plurality of input/output leads. The apparatus includes a support structure having a first side and a second side. The first side is adapted to have the input/output leads of the circuit component attached thereto. A signal routing strip having a first end and a second end is also included. The first end of the routing strip is configured and adapted to be electrically connected to the input/output leads of the circuit component for transmitting signals to and from the circuit component.

The present device for routing signals to and from a plurality of input/output leads on a circuit component includes a strip having a first side and a second side, and a first end and a second end. A plurality of electrically conductive traces are imbedded in the strip between the first side and the second side. A plurality of electrical terminals extend from the conductive traces and protrude from the strip at the first end and the second end on at least the first side. The terminals at the first end of the strip are configured and adapted to be connected to the input/output leads on a first circuit component to enable signals to be transmitted to and from the first circuit component from and to the terminals at the second end of the strip.

The present invention also relates to an integrated circuit device including a die for performing the functions of the integrated circuit device. The die has a plurality of input/output terminals. Also included is a package which is configured and adapted to receive the die, and has a top surface and a bottom surface. A plurality of external connection leads are formed on the top surface and the bottom surface of the package, and connected to the input/output terminals of the die.

The external connection leads on the top surface are configured and adapted to be attached to corresponding input and output leads of a circuit component placed over the top surface of the package, so that the circuit component can be stacked directly on the top of the integrated circuit device.

Figure 1:
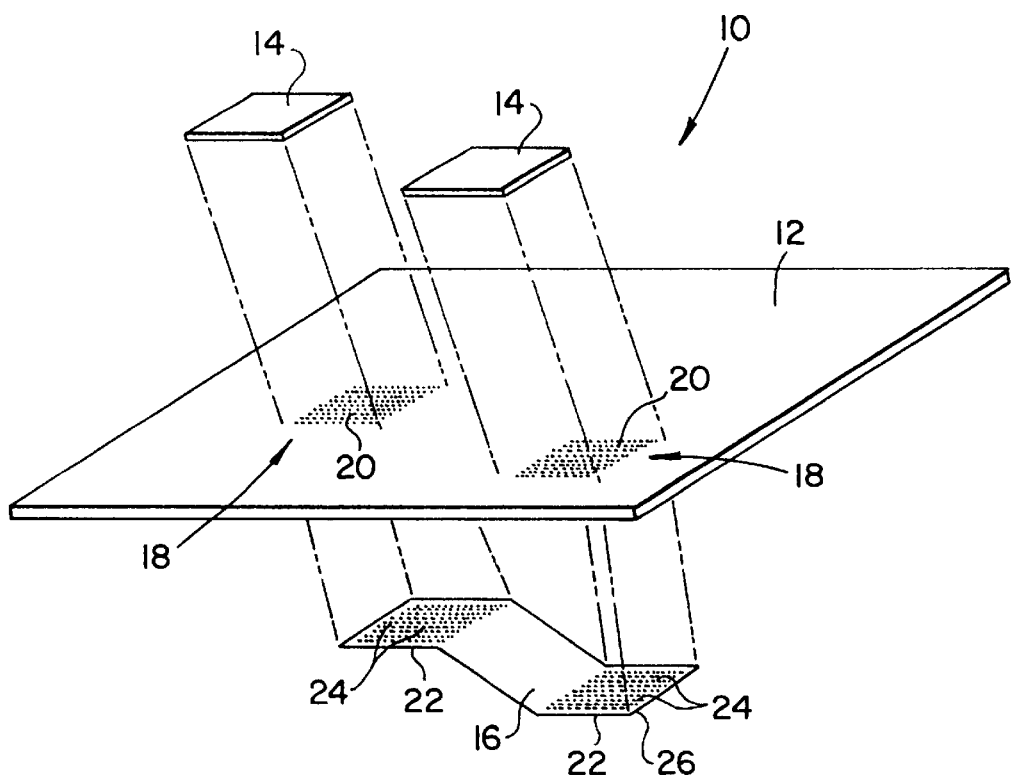
FIG. 1 is a simplified perspective view of a signal routing apparatus in accordance with one embodiment of the present invention.

Turning now to FIG. 1, the signal routing apparatus of one embodiment of the present invention is indicated generally at 10 and includes a support structure 12, preferably a printed circuit board (PCB), a plurality of circuit components 14 (two shown), and at least one routing strip 16. The support structure 12 is constructed from known material used for fabricating PCBs, such as fiberglass, for example, and includes a plurality of electrical and/or mechanical interfaces or land patterns 18 (two shown). Each land pattern 18 is made of a plurality of electrically conductive holes or vias 20 which extend partially or completely through the support structure 12. The circuit components 14, such as integrated circuits (ICs), are adapted to be positioned over the land patterns 18 So that the input/output leads of the circuit components (shown in FIG. 2 as 44) make electrical contact with the vias 20. Accordingly, the vias 20 are arranged to match at least the pattern of the electrical input/output leads 44 of a corresponding circuit component 14. Preferably, each land pattern 18 includes a sufficient number of vias 20 to accommodate the different input and output configurations patterns of various circuit components 14.

The routing strips 16 are adapted to transmit signals to and from the circuit components 14 on the support structure 12. They transmit various data signals, as well as power to the circuit components 14, if required. The routing strips 16 may also have signal lines for providing ground for the circuit components 14. At least two end portions 22 are provided on each of the routing strips 16, with each end portion having a plurality of electrical terminals 24. These terminals 24 are adapted to be connected to the land patterns 18 on the opposite side of the support structure 12 from the circuit components 14. In this manner, the terminals 24 electrically connect to the circuit components 14 through the vias 20, and signals to and from the circuit components are transmitted by the routing strips 16. Accordingly, the terminals 24 at one end portion 22 are arranged to correspond to the input/output lead configuration on the corresponding circuit component 14. The terminals at the other end portion 22 are arranged to correspond to the input/output lead configuration of its corresponding circuit component. In this manner, signals between the circuit components 14 at the two end portions 22 are transmitted by the routing strip 16. The preferred manner of connecting the terminals 24 of the routing strip 16 to the vias 20 is to attach solder balls to the terminals, align the terminals to the corresponding vias and heat in oven until the terminals and the vias are soldered together.

Figure 2:
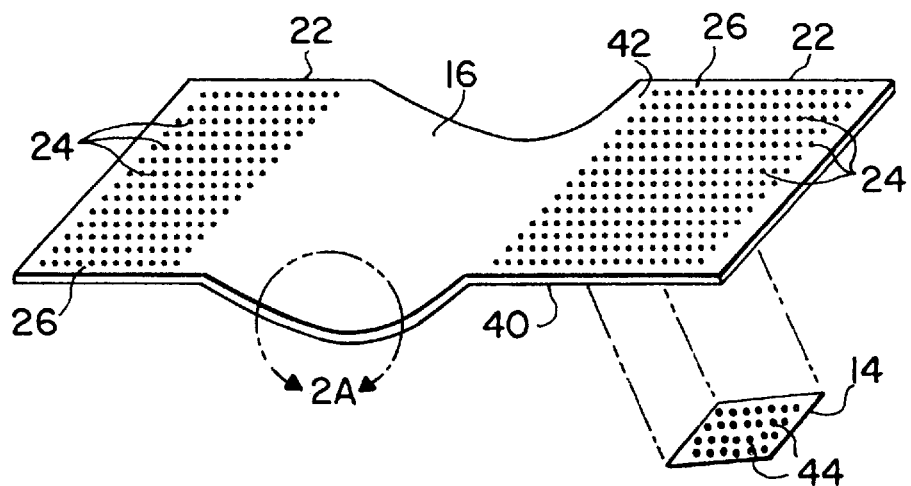
FIG. 2 is a perspective view of a routing strip shown in FIG. 1.
Figure 2A:
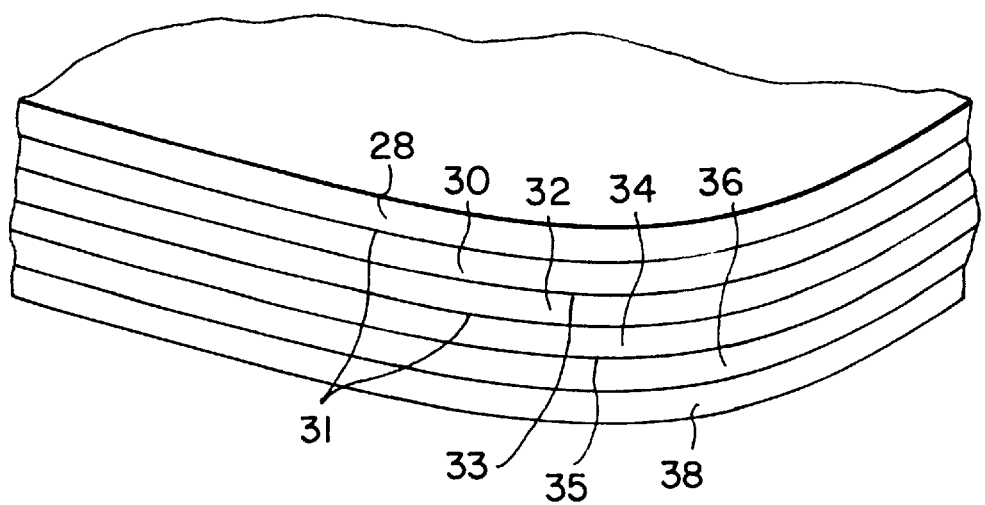
FIG. 2A is an enlarged side view of encircled section 2A of the routing strip of FIG. 2.

Turning now to FIG. 2, the routing strip 16 is shown with the two end portions 22 having the plurality of terminals 24 in a pattern 26. It should be noted that the routing strips 16 may have more than two end portions 22 to carry signals between increased number of circuit components 14. In an embodiment shown in FIG. 2A, the routing strip 16 includes a top insulating/shield layer 28, a first signal trace layer 30, a power plane 32, a second signal trace layer 34, a ground plane 36 and a bottom insulating/shield layer 38. The top and the bottom insulating/shield layers 28, 38 insulate the routing strips 16 when they are attached directly to the support structure 12 on which the circuit components 14 are provided, and/or acts as a shield when high frequency signals are being transmitted by the routing strips. The first and the second signal trace layers 30, 34 have electrically conductive wires or traces 31 imbedded therein for carrying signals to and from the circuit components 14. These traces begin and end at the terminals 24 on the end portions 22 of the routing strip 16. Power, if required, is supplied to the circuit components 14 by electrically conductive traces or wires 33 embedded in the power plane 32. The ground plane 36 provides an electrical path in the form of a wire or trace 35 through which the circuit components 14 on the support structure 12 are grounded.

It should be understood that the routing strip 16 described above depicts only one embodiment, and that it can have alternative arrangements. For example, the routing strip 16 may or may not include the power plane 32 or the ground plane 36, depending on the type of circuit components 14 to which the routing strip 16 is designed to be connected. Also, depending on the number of signals that the routing strip 16 is designed to carry, it may have one or more signal trace layers 30. Further, the routing strip 16 may be constructed from a rigid material such as fiberglass, for example, or from a flexible plastic material.

In accordance with another embodiment of the present invention, and referring still to FIG. 2, the routing strip 16 is provided with the terminals 24 on a bottom side 40 of the routing strip, in addition to those on a top side 42. The terminals 24 on the bottom side 40 allow the circuit components 14 to be attached directly to the routing strip 16 itself, in addition to the support structure 12, thereby further reducing complexity and congestion on the support structure 12. As with the terminals 24 on the top side 42 of the routing strip 16, the bottom side terminals 24 are arranged in a pattern to correspond at least to the input/output leads 44 of the corresponding circuit component 14.

As a variation of this embodiment, it is contemplated that all the circuit components 14 be attached directly to the routing strips 16, thereby eliminating the necessity of the support structure 12, such as a PCB, altogether. The routing strips 16 can then be attached to the plastic, metal or other surfaces of the intended product housing the circuit components 14.

Figure 3:
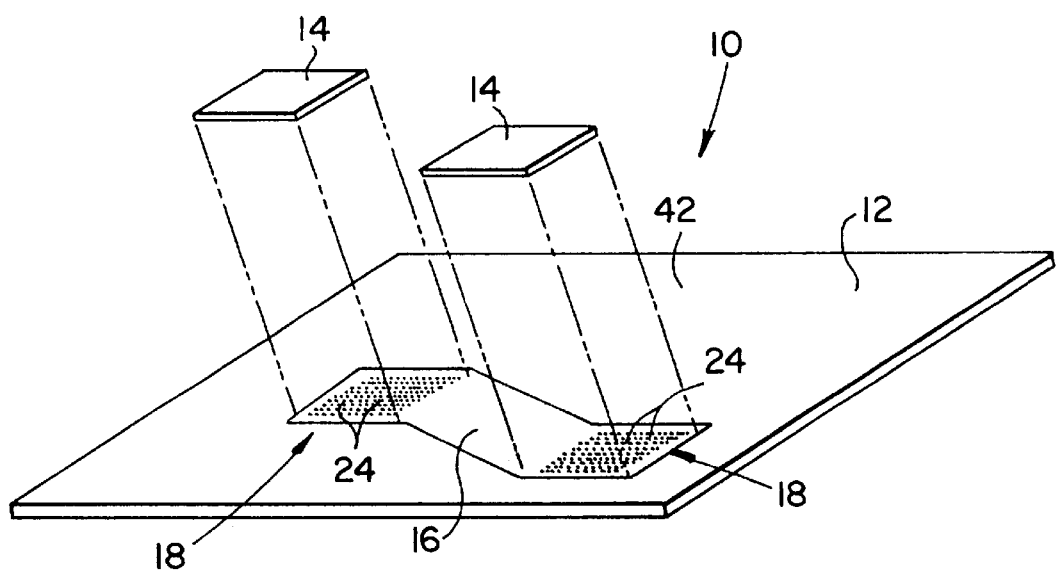
FIG. 3 is a perspective view of another embodiment of a signal routing apparatus according to the present invention.

Turning now to FIG. 3, and in accordance with another aspect of the present invention, the routing strip 16 is attached to the support structure 12 on the same side as the circuit components 14. In this embodiment, the routing strip 16 is attached to the top surface 42 of the support structure 12 and the input/output leads of the circuit components 14 are attached to the terminals 24 of the routing strip. This arrangement eliminates the necessity of creating vias 20 (shown in FIG. 1) on the support structure 12, which results in further reduction in manufacturing costs.

Figure 4:
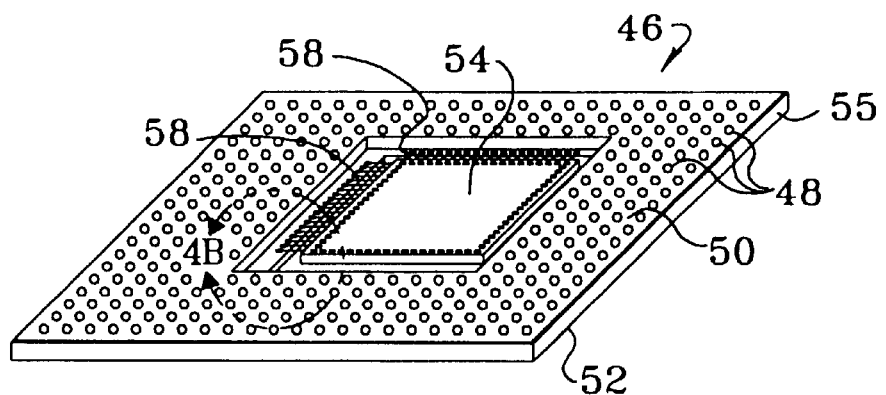
FIG. 4 is a perspective view of an integrated circuit (IC) in accordance with the invention.
Figure 4A:
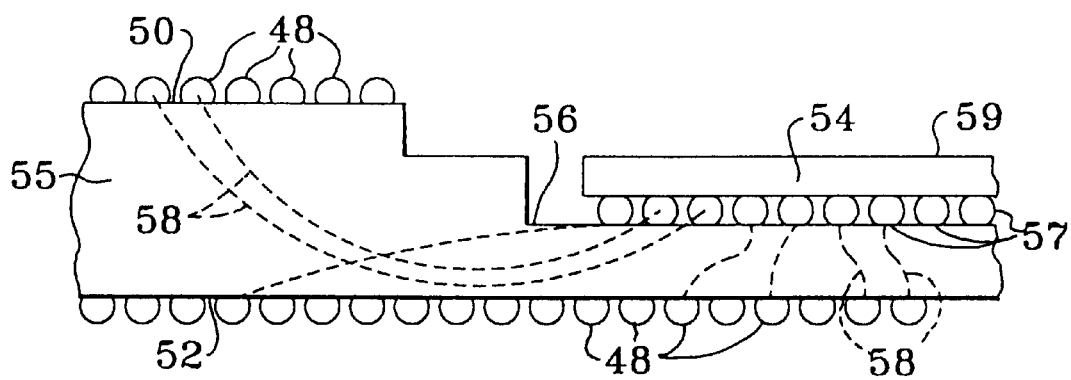
FIG. 4A is an enlarged view of a section of FIG. 4, illustrating the connection between a die and a package of the IC.
Figure 4B:
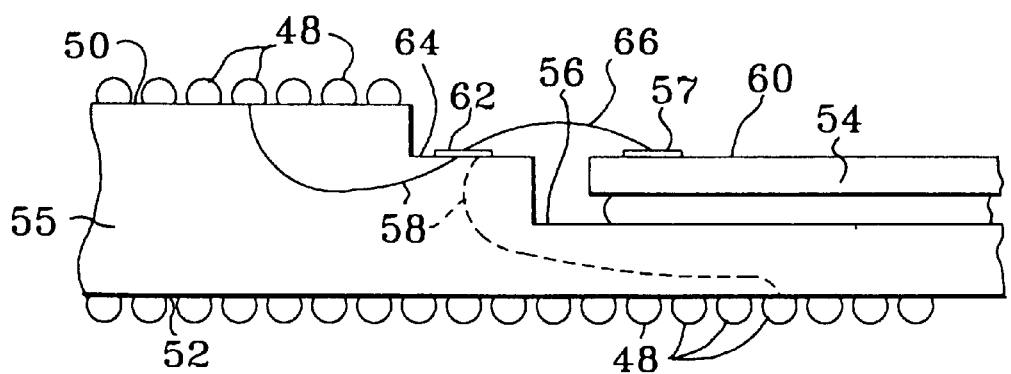
FIG. 4B is an enlarged view of section 4B of FIG. 4, illustrating an alternative method of making the connection between the die and the package.

Referring to FIGS. 4 and 4A–4B, one embodiment of an integrated circuit (IC) 46 in accordance with the invention includes input/output leads 48 formed both on its top surface 50 and a bottom surface 52. As in conventional ICs, the input/output leads 48 on the bottom surface 52 of the present IC 46 transmit signals to and from a die 54, the portion of the IC that performs the designed functions. In addition, the IC 46 of the present invention is adapted to also transmit signals to and from the die 54 through its input/output leads 48 on the top surface 50.

More specifically, the die 54 is seated in a depression or well 56 (best shown in FIGS. 4A and 4B) of a package 55. The package 55 houses the die 54 and also provides the surfaces 50, 52 from which the input/output leads 48 are allowed to protrude. In accordance with one embodiment of the invention as shown in FIG. 4A, the die 54 is provided with a plurality of input/output terminals 57 on its bottom surface that faces the floor of the well 56. The input/output terminals 57 may be solder balls which when heated bond to the package 55 on the floor of the well 56. The input/output terminals 57 are arranged such that they make electrical connections with the ends of electrical conductors 58 imbedded in the package 55. Each of the electrical conductors 58 have one end which is exposed on the floor of the well 56 and the other end connected to the input/output leads 48 on the top 50 or the bottom 52 surfaces of the package 55. This arrangement allows the input/output terminal 57 of the die 54 to be electrically connected to the input/output lead 48 on the top 50 and the bottom 52 surfaces of the package 55 when the die is bonded to the floor of the well 56.

FIG. 4B shows another embodiment of the invention in which the die 54 is adhered to floor of the well 56 in the package 55, but does not have the input/output terminals 57 provided on its bottom surface. Rather, they are provided on the top surface 60 of the die 54. In the preferred embodiment, the input/output terminals 57 are electrically conductive pads disposed along the periphery of the die 54. However, other configurations and manners of forming the terminals 57 are contemplated as dictated by design choice. The input/output terminals 57 are connected to the corresponding input/output leads 48 on the top 50 and the bottom 52 surfaces of the package 55 via connection points 62 which are provided along the periphery 64 of the well 56. The connection points 62 are electrically connected to the input/output terminals 57 by wires 66, and to the input/output leads 48 on the top 50 and the bottom 52 surfaces of the package 55 through conductors 58 embedded in the package 55, thereby completing the signal paths from the die 54 to the input/output leads 48 on the package.

Figure 5:
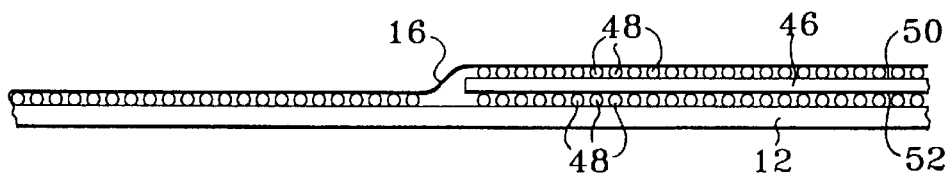
FIG. 5 is a simplified side view showing the integrated circuit (IC) of FIG. 4 attached to a printed circuit board and a routing strip; and, FIG. 6 is a perspective view illustrating the manner in which a circuit component is attached to the IC of FIG. 4.

The IC 46 of the present invention is particularly adapted to be used in conjunction with the above-described routing strip 16, as shown in FIG. 5. In FIG. 5, one end of the routing strip 16 is shown attached to the input/output leads 48 on the top surface 50 of the IC 46, and the other end attached to the support structure 12, preferably a PCB. The input/output leads 48 on the bottom surface 52 of the IC 46 are attached to the support structure 12. This arrangement increases the signal routing flexibility to and from the IC 46. For example, high frequency, path critical (length, impedance, etc.) signals might be routed through those connections between the support structure 12 and the IC 46, while less path critical signals might be routed through the routing strip 16.

Figure 6:
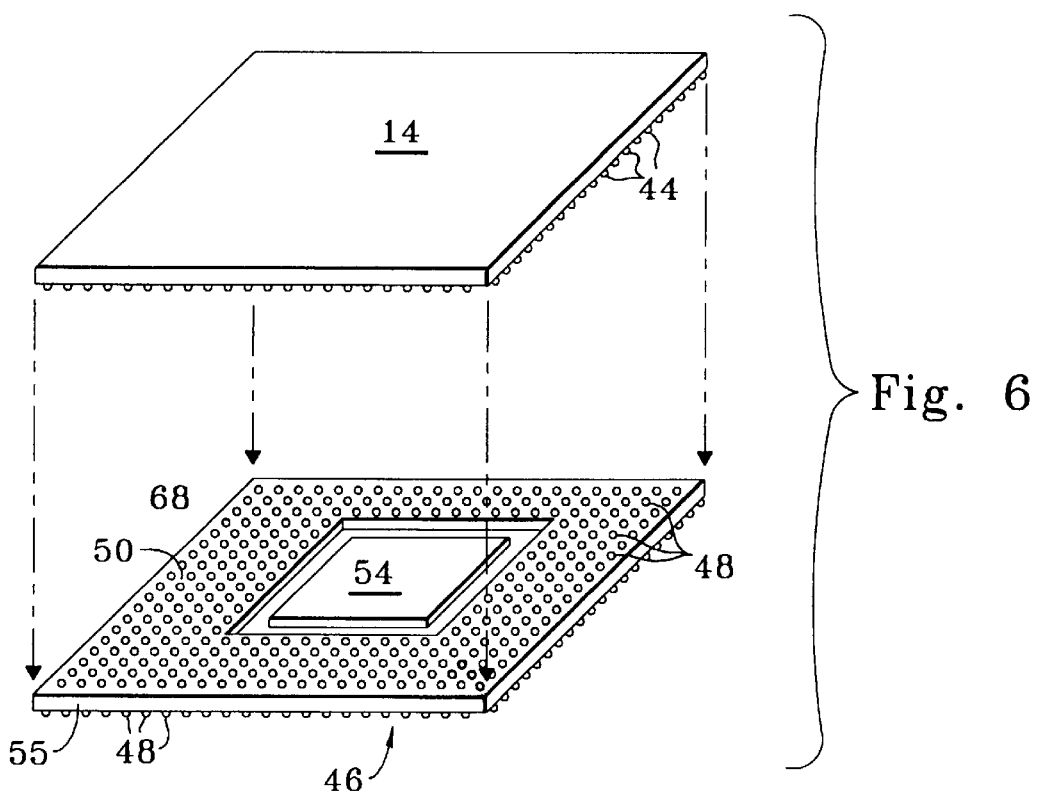

The input/output leads 48 on the top surface 50 of the package 55 also allow the circuit component 14 to be mounted directly onto the IC 46. An embodiment of this feature is illustrated in FIG. 6, which shows the IC 46 having input/output leads 48 formed on the top surface 50 of the package 55 and on the bottom surface 52. The connections between the input/output leads 48 and the die 54 are made in accordance with the descriptions given above. The input/output leads 48 on the top surface 50 form a land pattern 68 (i.e., a plurality of electrical interfaces), to allow the circuit component 14 to be attached directly onto the top surface 50 of the IC 46. The circuit component 14 shown in the FIG. 6 is a conventional IC having the input/output leads 44 on its bottom surface corresponding to the input/output leads 48 of the land pattern 68. The input/output leads 44 of the circuit component 14 may be solder balls, for example, when heated and then cooled, are adapted to attach themselves to their respective input/output leads 48 of the IC 46.

The input/output leads 48 on the bottom of the IC 46 are adapted to be connected to a corresponding land pattern 18 on the support structure 12 such as a PCB (best shown in FIG. 1). Alternatively, the IC 46, with or without the circuit component 14 attached, can be mounted on another IC 46. In this arrangement, the input/output leads 48 on the bottom 50 of the first or top IC 46 would be arranged to make electrical connection with their corresponding input/output leads 48 formed on the top surface 52 of the second or bottom IC 46. The second or bottom IC 46 may either be attached to the support structure 12 or to the top surface 50 of yet another or third IC 46, thereby further reducing congestion on the support structure 12 and increasing signal routing flexibility.

From the foregoing description, it can be seen that the various embodiments of the present invention help reduce the complexity and congestion on the signal carrying support structure by carrying signals on separate routing strips and/or stacking ICs directly on top of each other. These arrangements contribute to prevention of stress fracturing of signal traces as the support structure becomes larger. The routing strip also allows the support structure to be standardized by providing the same land patterns on all the support structures and merely changing the circuit components and the routing strips for different applications. The routing strip also enables ICs to have input/output terminals on the top side of the package, thereby further increasing signal routing flexibility.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

What is claimed is:

1. Apparatus for routing signals between input/output leads of at least two circuit components on a circuit board, said apparatus comprising:

a strip having a first side and a second side, and a first end and a second end;

a plurality of electrically conductive traces imbedded in said strip between said first side and said second side; and, a plurality of electrical terminals extending from said conductive traces and protruding from said strip at said first end and said second end on at least said first side, wherein said terminals at said first end of said strip are configured and adapted to be connected to the plurality of input/output leads on a first circuit component to route signals to and from the first circuit component from and to said terminals at said second end of said strip and wherein said terminals at said second end on said first side of said strip are configured and adapted to be attached to the input/output leads of a second circuit component on the circuit board.

2. The apparatus as defined in claim 1 wherein said terminals are arranged substantially in a matrix pattern including a plurality of said terminals along both rows and columns of said matrix.

3. The apparatus as defined in claim 1 wherein said strip is substantially flexible.

4. Apparatus for routing signals between at least two circuit components having a plurality of input/output leads, said apparatus comprising:

a support structure having a first side and a second side, said first side being adapted to have the input/output leads of a first circuit component attached thereto; and, a signal routing strip having a first end and a second end, said first end being configured and adapted to be electrically connected to the input/output leads of the first circuit component for transmitting signals to and from the first circuit component wherein said second end of said routing strip is attached to a second circuit component on said support structure so that said signals can be transmitted between the second circuit component and the first circuit component.

5. The apparatus as defined in claim 4 further including a plurality of conductive patterns formed on said support structure and extending from said first side to said second side, wherein the input/output leads of a first circuit component are adapted to be connected to a corresponding conductive pattern at said first side of said support structure.

6. The apparatus as defined in claim 5 wherein said signal routing strip includes a first side and a second side and a plurality of electrical terminals formed on at least said first side at said first end and said second end, and said terminals on said first end of said first side are adapted to be connected to said conductive pattern that corresponds to the input/output leads of the first circuit component at said second side of said support structure.

7. The apparatus as defined in claim 6 wherein a plurality of electrical terminals are provided on said second side of said signal routing strip at said first end and said second end, said terminals being configured and adapted to have at least one circuit component attached thereto at at least one of said first end and said second end.

8. The apparatus as defined in claim 6 wherein said electrical terminals at said second end of said signal routing strip are attached to said support structure so that signals can be transmitted between said support structure and the first circuit component.

9. The apparatus as defined in claim 8 wherein said electrical terminals at said second end of said signal outing strip are configured and adapted to be attached to the input/output leads of a second circuit component which is attached to said first side of said support structure through a conductive pattern corresponding to the input/output leads of the second circuit component.

10. The apparatus as defined in claim 4 wherein said second end of said routing strip is attached to said first side of said support structure so that said signals can be transmitted between said support structure and the first circuit component.

11. The apparatus as defined in claim 4 wherein said second end of said routing strip is attached to said second circuit component on said first side of said support structure so that said signals can be transmitted between said second circuit component and the first circuit component.

12. The apparatus as defined in claim 4 wherein said first end of said routing strip is adapted to be electrically connected to the input/output leads on a top of the first circuit component, and the input/output leads on a bottom of the first circuit component is adapted to be attached said support structure.

13. The apparatus as defined in claim 4 wherein said first end of said routing strip is disposed between the input/output leads on a bottom of the first circuit component and said first side of said support structure.

14. The apparatus as defined in claim 4, where said support structure is a printed circuit board (PCB).

* * * * *